US012684939B2

(12) United States Patent
Lee et al.

(10) Patent No.: US 12,684,939 B2
(45) Date of Patent: Jul. 14, 2026

(54) DISPLAY APPARATUS INCLUDING A BENDING PROTECTION LAYER OVER A CONNECTION WIRE

(71) Applicant: Samsung Display Co., Ltd., Yongin-si (KR)

(72) Inventors: Jeongseok Lee, Yongin-si (KR); Ohjune Kwon, Yongin-si (KR); Wooyong Sung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 632 days.

(21) Appl. No.: 17/936,833

(22) Filed: Sep. 29, 2022

(65) Prior Publication Data

US 2023/0180513 A1     Jun. 8, 2023

(30) Foreign Application Priority Data

Dec. 3, 2021     (KR) ......................... 10-2021-0172261

(51) Int. Cl.

| | |
|---|---|
| *H10K 50/844* | (2023.01) |
| *H10K 50/80* | (2023.01) |
| *H10K 59/122* | (2023.01) |
| *H10K 59/131* | (2023.01) |
| *H10K 102/00* | (2023.01) |

(52) U.S. Cl.
CPC ......... *H10K 50/844* (2023.02); *H10K 50/868* (2023.02); *H10K 59/122* (2023.02); *H10K 59/131* (2023.02); *H10K 2102/311* (2023.02)

(58) Field of Classification Search
CPC .. H10K 50/844; H10K 50/868; H10K 59/122; H10K 59/131; H10K 2102/311; H10K 59/8731; H10K 77/111; H10K 59/12; H10K 59/873; H10K 59/8791; H10K 50/8445; H10K 50/841; H10K 50/86; Y02E 10/549
USPC .......................................................... 257/40
See application file for complete search history.

(56) References Cited

U.S. PATENT DOCUMENTS

| | | | |
|---|---|---|---|
| 9,614,168 | B2 | 4/2017 | Zhang et al. |
| 10,153,457 | B2 | 12/2018 | Son et al. |
| 10,490,755 | B2 | 11/2019 | Jang et al. |

(Continued)

FOREIGN PATENT DOCUMENTS

| | | |
|---|---|---|
| KR | 10-2017-0020674 A | 2/2017 |
| KR | 10-2018-0018966 A | 2/2018 |

(Continued)

*Primary Examiner* — Norman D Richards
*Assistant Examiner* — Laura M Dykes
(74) *Attorney, Agent, or Firm* — Womble Bond Dickinson (US) LLP

(57)     ABSTRACT

A display apparatus includes a substrate including a first area, a second area, and a bending area between the first area and the second area, a plurality of display devices arranged in the first area, a thin film encapsulation layer covering the plurality of display devices and including a first inorganic encapsulation layer, an organic encapsulation layer, and a second inorganic encapsulation layer, a connection wire extending from the first area to the second area across the bending area, and a bending protection layer covering the connection wire in the bending area and covering at least a portion of the thin film encapsulation layer, and the bending protection layer includes a light-blocking material.

19 Claims, 10 Drawing Sheets

(56)              References Cited

U.S. PATENT DOCUMENTS

| | | | |
|---|---|---|---|
| 10,897,018 B2 | 1/2021 | Jeon et al. | |
| 2017/0047547 A1 | 2/2017 | Son et al. | |
| 2018/0047802 A1* | 2/2018 | Yoon | H10K 59/1213 |
| 2019/0095007 A1* | 3/2019 | Jeong | H10K 59/131 |
| 2019/0267569 A1* | 8/2019 | Kim | H10K 59/8791 |
| 2020/0152707 A1 | 5/2020 | Won et al. | |
| 2020/0411629 A1* | 12/2020 | Kim | H10K 59/126 |
| 2021/0193972 A1* | 6/2021 | Noh | H10K 50/865 |
| 2021/0265436 A1 | 8/2021 | Jeon et al. | |
| 2022/0158139 A1* | 5/2022 | Kim | H10K 59/18 |
| 2022/0181592 A1* | 6/2022 | Jeong | B32B 27/281 |
| 2024/0206252 A1* | 6/2024 | Li | H10K 77/111 |

FOREIGN PATENT DOCUMENTS

| | | | | |
|---|---|---|---|---|
| KR | 10-2018-0033364 A | 4/2018 | | |
| KR | 10-1899831 B1 | 11/2018 | | |
| KR | 10-2019-0100564 A | 8/2019 | | |
| KR | 10-2020-0053991 A | 5/2020 | | |
| KR | 20210086318 A * | 7/2021 | | G06F 1/1652 |
| KR | 10-2021-0107218 A | 9/2021 | | |

* cited by examiner

FIG. 5

DISPLAY APPARATUS INCLUDING A BENDING PROTECTION LAYER OVER A CONNECTION WIRE

CROSS-REFERENCE TO RELATED APPLICATION

This application claims priority to and the benefit of Korean Patent Application No. 10-2021-0172261, filed on Dec. 3, 2021 in the Korean Intellectual Property Office, the entire disclosure of which is incorporated by reference herein.

BACKGROUND

1. Field

Aspects of one or more embodiments relate to a display apparatus.

2. Description of the Related Art

A display apparatus visually displays data. A display apparatus typically includes a substrate divided into a display area and a non-display area. A plurality of pixel areas are defined in the display area. In addition, a thin-film transistor and a pixel electrode electrically connected to the thin-film transistor are provided in the display area to correspond to each of the pixel areas. Various conductive layers, such as wirings for transmitting electrical signals to the display area are provided in the non-display area.

By bending at least a portion of the display apparatus, visibility at various angles may be improved or the area of a non-display area may be reduced. Methods of minimizing or reducing defects and reducing the cost of a process of manufacturing such a bent display apparatus have been investigated.

SUMMARY

According to an aspect of one or more embodiments, a display apparatus with a reduced viewing angle dead space is provided. According to another aspect of one or more embodiments, a display apparatus including a bending area and in which an area of a non-display area for a viewing angle may be reduced is provided.

However, aspects of the present disclosure are not limited to the technical aspects described above, and other technical aspects not described herein will be understood from the present description by those of ordinary skill in the art.

Additional aspects will be set forth, in part, in the description which follows and, in part, will be apparent from the description, or may be learned by practice of the presented embodiments of the disclosure.

According to one or more embodiments, a display apparatus includes a substrate including a first area, a second area, and a bending area between the first area and the second area, a plurality of display devices arranged in the first area, a thin film encapsulation layer covering the plurality of display devices and including a first inorganic encapsulation layer, an organic encapsulation layer, and a second inorganic encapsulation layer, a connection wire extending from the first area to the second area across the bending area, and a bending protection layer covering the connection wire in the bending area and covering at least a portion of the thin film encapsulation layer, wherein the bending protection layer includes a light-blocking material.

An optical density (OD) of the bending protection layer may be greater than or equal to 1 and less than or equal to 5.

The display apparatus may further include a dam around (e.g., surrounding) a display area in the first area, wherein the plurality of display devices may be arranged in the display area, wherein the bending protection layer may overlap at least a portion of the dam.

The display apparatus may further include a common power line at least partially surrounding the display area, wherein the dam may cover an edge of the common power line.

The dam may include a first dam and a second dam spaced apart from each other, wherein the bending protection layer may overlap the first dam and the second dam.

The plurality of display devices may include a common opposite electrode, and the bending protection layer may cover an end of the common opposite electrode.

Emission areas of the plurality of display devices may be defined by openings in a pixel-defining layer arranged in the first area, and the bending protection layer may at least partially overlap the pixel-defining layer.

The display apparatus may further include a polarizing film over the plurality of display devices in the first area, wherein at least a portion of the bending protection layer may be between the substrate and the polarizing film.

The display apparatus may further include an inorganic insulating layer disposed on the substrate and including an opening or a groove corresponding to the bending area, wherein the inorganic insulating layer may be between the substrate and the connection wire.

The display apparatus may further include an organic material layer arranged between the inorganic insulating layer and the connection wire and filling the opening or the groove.

At least a portion of an upper surface of the organic material layer may include a corrugated surface.

The display apparatus may further include a protection film on a lower surface of the substrate, wherein the protection film may include an opening portion corresponding to the bending area.

According to one or more embodiments, a display apparatus includes a substrate including a first area, a second area, and a bending area between the first area and the second area, a plurality of display devices arranged in the first area, a polarizing film arranged in the first area and located over the plurality of display devices, a connection wire extending from the first area to the second area across the bending area, and a bending protection layer covering the connection wire in the bending area, wherein at least a portion of the bending protection layer overlaps the polarizing film, and the bending protection layer includes a light-blocking material.

An optical density (OD) of the bending protection layer may be greater than or equal to 1 and less than or equal to 5.

The display apparatus may further include a thin film encapsulation layer covering the plurality of display devices and including a first inorganic encapsulation layer, an organic encapsulation layer, and a second inorganic encapsulation layer, and a dam around (e.g., surrounding) a display area in the first area, wherein the plurality of display devices may be arranged in the display area, wherein the bending protection layer may overlap at least a portion of the dam.

The display apparatus may further include a common power line at least partially surrounding the display area, wherein the dam may cover an edge of the common power line.

The plurality of display devices may include a common opposite electrode, and the bending protection layer may cover an end of the common opposite electrode.

Emission areas of the plurality of display devices may be defined by openings in a pixel-defining layer arranged in the first area, and the bending protection layer may at least partially overlap the pixel-defining layer.

The display apparatus may further include an inorganic insulating layer arranged on the substrate and including an opening or a groove corresponding to the bending area, and an organic material layer arranged between the inorganic insulating layer and the connection wire and filling the opening or the groove.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 5 is a partial cross-sectional view of the display apparatus of FIG. 3, taken along the line I-I';

DETAILED DESCRIPTION

Figure 1:
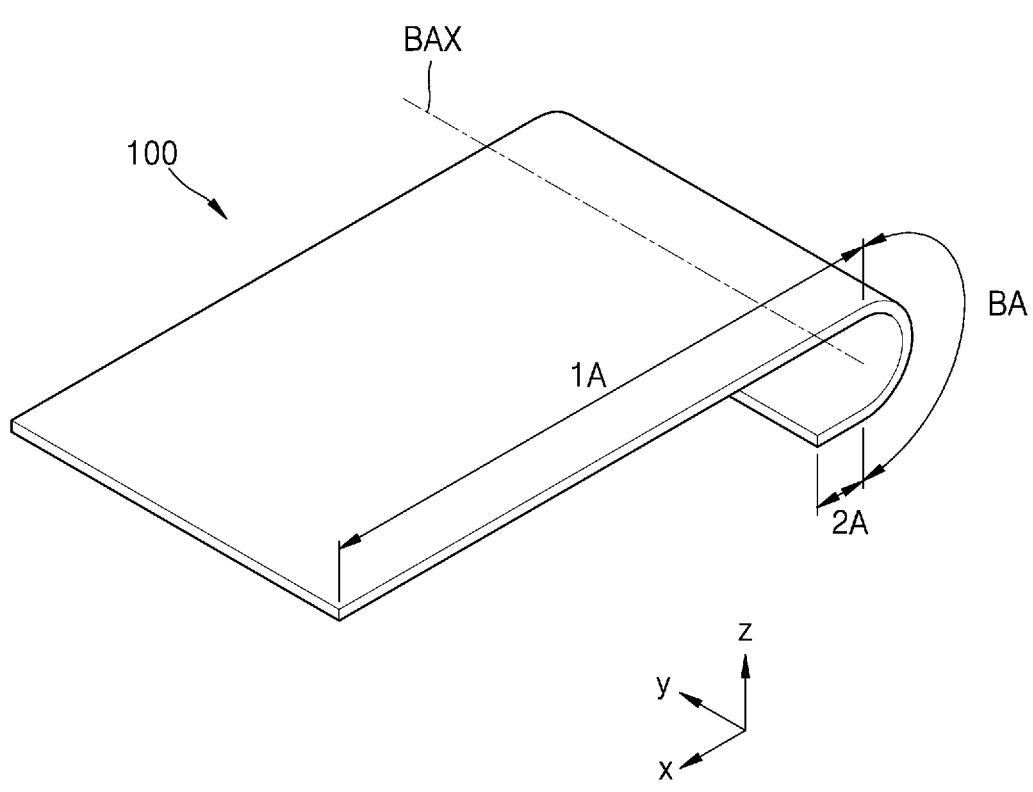
FIG. 1 is a schematic perspective view of a portion of a display apparatus according to an embodiment.

Reference will now be made in further detail to embodiments, examples of which are illustrated in the accompanying drawings, wherein like reference numerals refer to like elements throughout. In this regard, embodiments may have different forms and should not be construed as being limited to the descriptions set forth herein. Accordingly, some embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in the written description. Effects and features of one or more embodiments and methods of accomplishing the same will become apparent from the following detailed description one or more embodiments, taken in conjunction with the accompanying drawings. However, the present embodiments may have different forms and should not be construed as being limited to the descriptions set forth herein.

One or more embodiments will be described below in further detail with reference to the accompanying drawings. Elements that are the same or are in correspondence with each other are given the same reference numeral regardless of the figure number, and redundant descriptions thereof may be omitted.

While such terms as "first" and "second" may be used to describe various elements, such elements are not limited to the above terms. The above terms are used to distinguish one element from another.

The singular forms "a," "an," and "the" as used herein are intended to include the plural forms as well unless the context clearly indicates otherwise.

It is to be understood that the terms "include," "comprise," and "have," as used herein, specify the presence of stated features or elements but do not preclude the addition of one or more other features or elements.

It is to be further understood that, when a layer, region, or element is referred to as being on another layer, region, or element, it may be directly or indirectly on the other layer, region, or element. That is, for example, one or more intervening layers, regions, or elements may be present.

Sizes of elements in the drawings may be exaggerated or reduced for convenience of explanation. For example, since sizes and thicknesses of elements in the drawings may be arbitrarily illustrated for convenience of explanation, the following embodiments are not limited thereto.

It is to be further understood that, when layers, regions, or elements are referred to as being connected to each other, they may be directly connected to each other or may be indirectly connected to each other with one or more intervening layers, regions, or elements therebetween. For example, when layers, regions, or elements are referred to as being electrically connected to each other, they may be directly electrically connected to each other or may be indirectly electrically connected to each other with one or more intervening layers, regions, or elements therebetween.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

Unless otherwise defined, all terms (including technical and scientific terms) used herein have the same meaning as commonly understood by one of ordinary skill in the art to which the present disclosure belongs. It is to be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

A display apparatus is an apparatus for displaying an image, and may be a liquid crystal display apparatus, an electrophoretic display apparatus, an organic light-emitting display apparatus, an inorganic light-emitting display apparatus, a field emission display apparatus, a surface-conduction electron-emitter display apparatus, a plasma display apparatus, a cathode-ray tube display apparatus, or the like.

Although an organic light-emitting display apparatus is described below as an example of a display apparatus according to an embodiment, a display apparatus described herein is not limited thereto, and any of various display apparatuses may be used.

Figure 2:
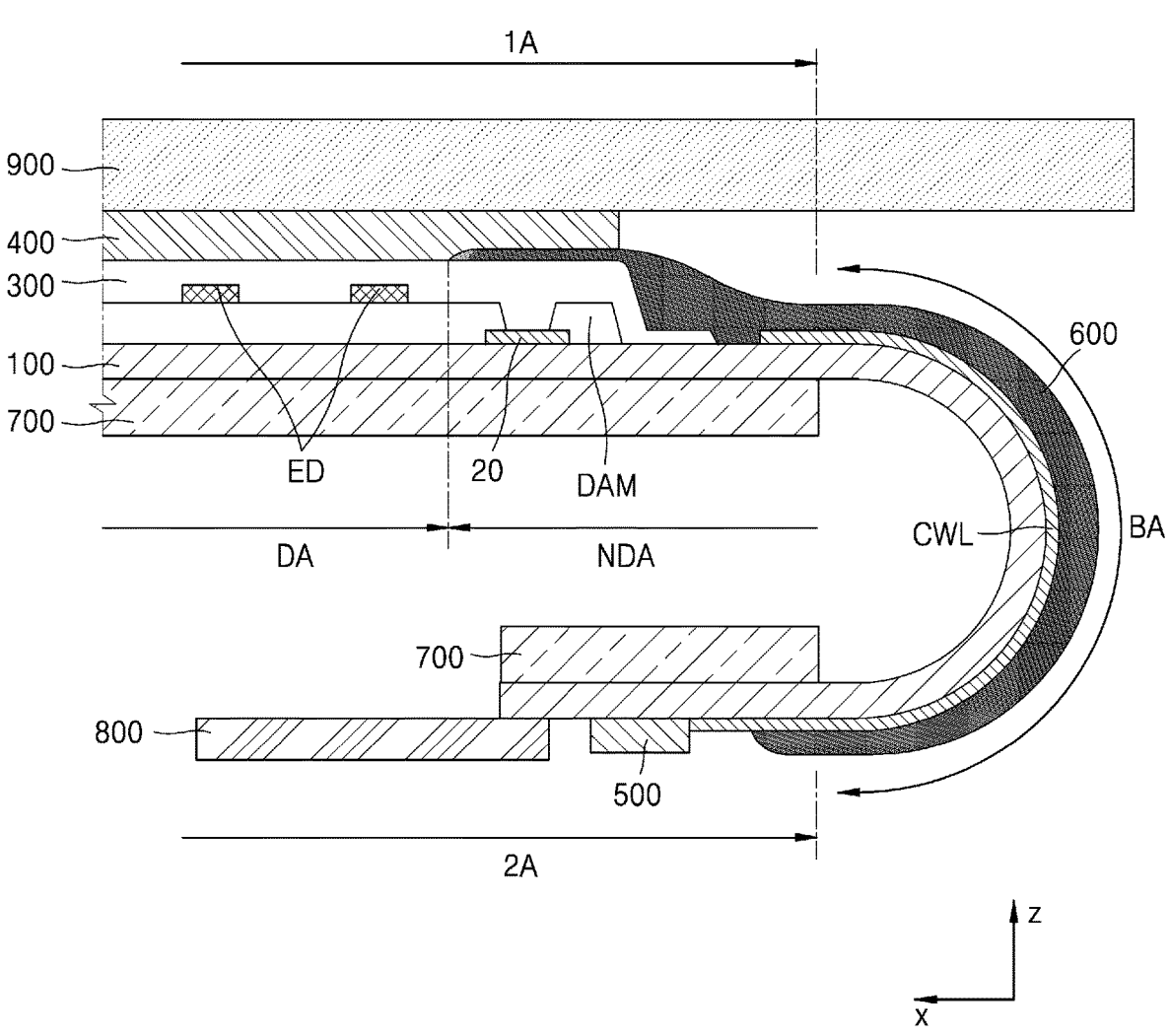
FIG. 2 is a schematic cross-sectional view of a portion of the display apparatus of FIG. 1.

FIG. 1 is a schematic perspective view of a portion of a display apparatus according to an embodiment. FIG. 2 is a schematic cross-sectional view of a portion of the display apparatus of FIG. 1.

In a display apparatus according to an embodiment, a substrate 100 which is a portion of the display apparatus is partially bent as shown in FIG. 1, and, thus, the display apparatus is also partially bent due to the bent substrate 100.

As shown in FIGS. 1 and 2, the substrate 100 included in the display apparatus according to an embodiment has a bending area BA extending in a first direction (e.g., a +y direction). In a second direction (e.g., +x direction) crossing the first direction, the bending area BA is located between a first area 1A and a second area 2A. For example, as shown in FIG. 1, the substrate 100 may be bent about a bending axis BAX extending in the first direction (e.g., the +y direction). Although FIG. 1 shows that the substrate 100 is bent about the bending axis BAX with a same radius of curvature, one or more embodiments are not limited thereto. For example, the substrate 100 may be bent about the bending axis BAX with non-uniform radii of curvature.

The substrate 100 may include any of various materials having flexible or bendable characteristics, for example, a polymer resin, such as polyethersulfone (PES), polyacrylate, polyetherimide (PEI), polyethylene naphthalate (PEN), polyphenylene sulfide (PPS), polyarylate (PAR), polyimide (PI), or cellulose acetate propionate (CAP). The substrate 100 may have a single-layer or multi-layer structure including the above-described material. In the case of the multi-layer structure, the substrate 100 may further include an inorganic layer.

Referring to FIG. 2, a display apparatus according to an embodiment includes the substrate 100 having the bending area BA between the first area 1A and the second area 2A, a plurality of display devices ED and a thin film encapsulation layer 300 arranged in the first area 1A, a panel driver 500 arranged in the second area 2A, and a bending protection layer 600 in the bending area BA and covering at least a portion of the thin film encapsulation layer 300, and the bending protection layer 600 includes a light-blocking material.

The first area 1A includes a display area DA. The first area 1A includes a portion of a non-display area NDA which is outside the display area DA, as well as the display area DA.

The plurality of display devices ED is arranged in the display area DA of the substrate 100, and an image may be implemented by emission of the plurality of display devices ED. The display devices ED may be organic light-emitting diodes, inorganic light-emitting diodes, or the like. The thin film encapsulation layer 300 may be disposed over the plurality of display devices ED. The thin film encapsulation layer 300 protects the display devices ED from external air and may include at least one inorganic encapsulation layer and at least one organic encapsulation layer.

A dam DAM may be arranged in the non-display area NDA of the first area 1A. The dam DAM may protrude from an upper surface of the substrate 100. The dam DAM may control the flow of an organic material to form an organic encapsulation layer of the thin film encapsulation layer 300. The dam DAM may overlap at least a portion of the thin film encapsulation layer 300. A common power line 20 for supplying a common voltage to the display area DA may be arranged in the non-display area NDA. In an embodiment, the dam DAM may at least partially overlap the common power line 20.

In the first area 1A, a polarizing film 400 may be provided on the thin film encapsulation layer 300. The polarizing film 400 may decrease reflectance of incident light (external light) travelling from the outside toward the display apparatus. In an embodiment, an adhesive layer may be disposed between the polarizing film 400 and the thin film encapsulation layer 300. The adhesive layer may be a transparent adhesive layer. For example, the adhesive layer may be an optically clear adhesive (OCA). However, one or more embodiments are not limited thereto, and, in an embodiment, the adhesive layer may be an optically clear resin (OCR). In another embodiment, the adhesive layer may include a pressure sensitive adhesive (PSA). The PSA may include a cured polymer. The PSA may include an acrylic-based or rubber-based adhesive, or an adhesive that contains particles, such as zirconia particles, in the above-described adhesive. In an embodiment, the display apparatus may not include the polarizing film 400, and, instead of the polarizing film 400, may include a filter plate including a black matrix and color filters.

A window member 900 may be disposed on the polarizing film 400. The window member 900 is a final end that provides a display surface to a user, and may protect lower configurations thereof. An optically transparent adhesive layer may be disposed between the window member 900 and the polarizing film 400. In an embodiment, the window member 900 may be arranged in correspondence with the display area DA and the non-display area NDA of the first area 1A and the bending area BA of the substrate 100.

The panel driver 500 may be arranged in the second area 2A. The panel driver 500 may be connected to a pad portion of the substrate 100 and supply a data signal and a scan signal to a gate line and a data line. The panel driver 500 may be, for example, a driver integrated circuit (IC), and may be mounted on the pad portion of the substrate 100. In this case, the pad portion may be electrically connected to the driver IC directly.

In an embodiment, a flexible printed circuit board 800 may be mounted on the pad portion of the substrate 100, and the driver IC may be mounted on the flexible printed circuit board 800. The flexible printed circuit board 800 may be a chip-on-film (COF) or a flexible printed circuit (FPC), and the driver IC supplying the signals to allow the plurality of display devices ED of the display area DA to emit light may be mounted on the flexible printed circuit board 800. However, various modifications may be made; for example, both of the panel driver 500 and the flexible circuit board 800 may be arranged in the second area 2A.

A connection wire CWL and the bending protection layer 600 disposed on the connection wire CWL may be arranged in the bending area BA of the substrate 100. The connection wire CWL may be configured to transmit signals provided from the panel driver 500 and/or the flexible printed circuit board 800 to the display area DA of the first area 1A. The bending protection layer 600 protects the connection wire CWL and may be a stress neutralization layer.

When a stack is bent, a stress neutral plane exists in the stack. If the bending protection layer 600 does not exist, an excessive tensile stress, etc. may be applied to the connection wire CWL that may be arranged in the bending area BA as the substrate 100, etc. is bent. This is because a location of the connection wire CWL may not correspond to the stress neutral plane. However, a location of the stress neutral plane may be adjusted for a stack including all of the substrate 100, the connection wire CWL, the bending protection layer 600, and the like by providing the bending protection layer 600 and adjusting a thickness, a modulus, etc. thereof. Accordingly, a tensile stress applied to the connection wire CWL may be reduced by locating the stress neutral plane near the wiring through the bending protection layer 600.

In an embodiment, the bending protection layer 600 may serve not only as a stress neutralization layer but also as a black matrix of the display apparatus. That is, the bending protection layer 600 may include a light-blocking material. In an embodiment, as the bending protection layer 600 includes a light-blocking material, an optical density of the bending protection layer 600 may be in a range of 1 to 5. The optical density is a value indicating the degree to which a material absorbs light. When an optical density of the bending protection layer 600 is 1 to 5, the bending protection layer 600 may cover a lower structure thereof and may absorb external light sufficiently.

When the bending protection layer 600 does not include a light-blocking material, and a black matrix is formed on the window member 900, an area for forming a black matrix may be limited to secure a viewing angle due to a distance between the display devices ED and the window member 900. Accordingly, elements such as the dam DAM or the common power line 20 arranged in the non-display area NDA may not be covered by the black matrix formed on the window.

In an embodiment, because the bending protection layer 600 including a light-blocking material may be arranged adjacent to the display area DA in which the display devices ED are arranged, various elements arranged in the non-display area NDA may not be externally visible, and, accordingly, an area of the non-display area NDA may be freely adjusted.

The bending protection layer 600 may cover an end of the thin film encapsulation layer 300 and may at least partially overlap the thin film encapsulation layer 300. The bending protection layer 600 may overlap the dam DAM. The bending protection layer 600 may be at least partially disposed between the thin film encapsulation layer 300 and the polarizing film 400.

The substrate 100 has a surface and another surface on a side opposite thereto, and the display devices ED may be located on the surface of the substrate 100. A protection film 700 may be located on the other surface of the substrate 100, which is opposite the surface on which the display devices ED are located. The protection film 700 may be attached on the other surface of the substrate 100 to protect the display apparatus. Although not shown, the protection film 700 may be attached on the other surface of the substrate 100 via an adhesive layer. In an embodiment, the protection film 700 may be located in the first area 1A and the second area 2A of the substrate 100 and may not be located in the bending area BA. In another embodiment, the protection film 700 may be located over the entirety of the other surface of the substrate 100, that is, the first area 1A, the second area 2A, and the bending area BA.

Figure 3:
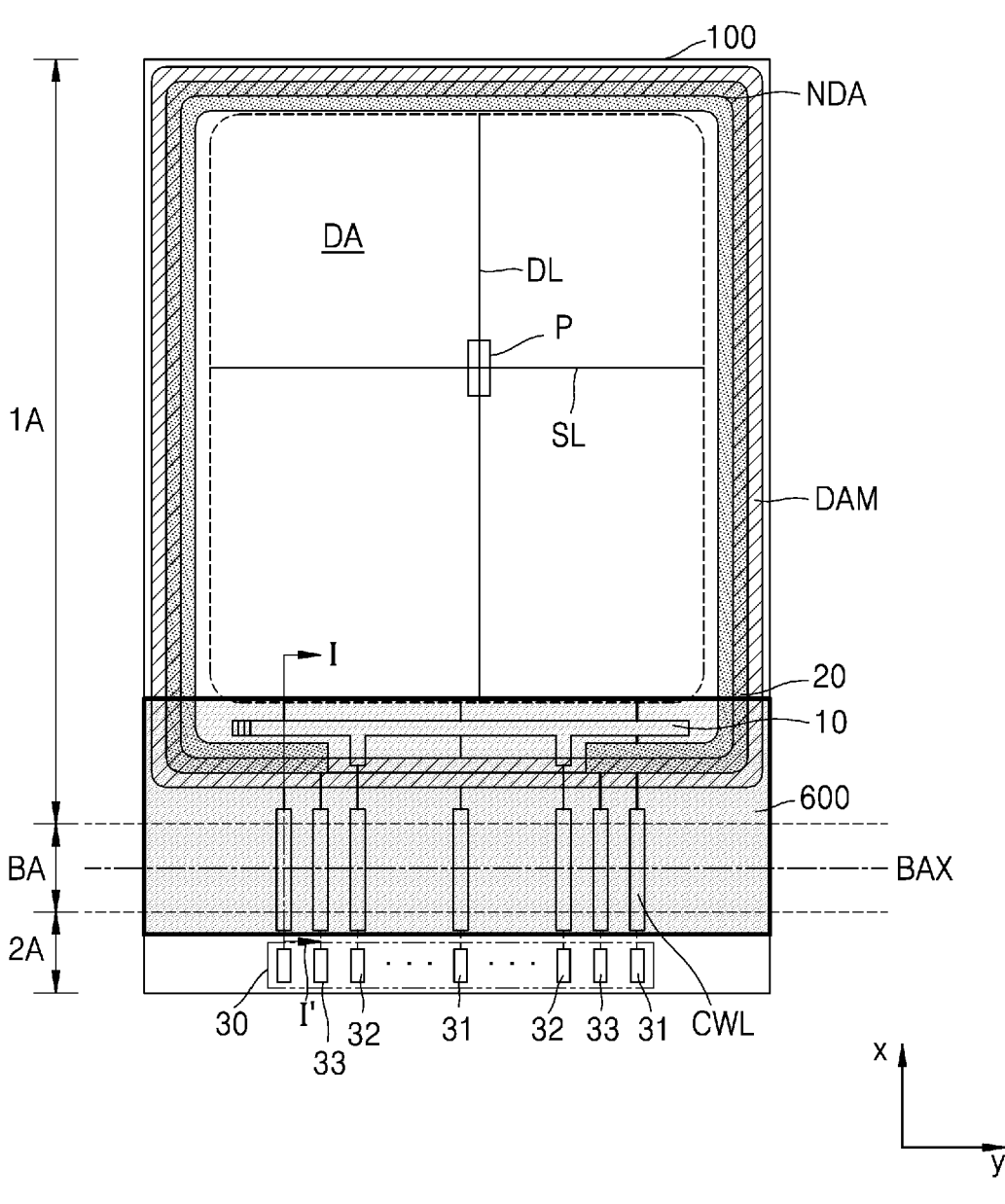
FIG. 3 is a schematic plan view of a portion of a display apparatus according to an embodiment.

FIG. 3 is a schematic plan view of a portion of a display apparatus according to an embodiment. For convenience of illustration, FIG. 3 shows the display apparatus in an unbent state.

The first area 1A of the substrate 100 includes the display area DA and the non-display area NDA arranged around the display area DA.

A plurality of pixels P may be arranged in the display area DA of the substrate 100 to display an image. The display area DA may include devices such as thin-film transistors, display devices such as organic light-emitting devices, and capacitors.

The display area DA may further include signal lines, such as a scan line SL configured to transmit a scan signal, a data line DL configured to transmit a data signal, a driving power line configured to transmit power, and a common power line. A pixel P may be formed by electric coupling of the thin-film transistor, the capacitor, the organic light-emitting device, and the like, connected to the scan line SL, the data line DL, and the driving power line, and may display an image. The pixel P may emit light at a brightness corresponding to a driving current passing through the organic light-emitting device in response to the data signal according to driving power and common power supplied to the pixel P. The signal lines may be connected to a controller connected to a pad portion 30 via the connection wire CWL of the non-display area NDA. The pixel P may be a plurality of pixels that may be arranged in various forms, such as a stripe layout, a PenTile layout, or the like.

The pad portion 30, a driving power line 10, the common power line 20, and connection wires CWL may be arranged in the non-display area NDA. In addition, although not shown, a gate driver, a data driver, etc. may be further arranged in the non-display area NDA.

In an embodiment, the pad portion 30 is arranged at an end portion of the non-display area NDA and includes a plurality of terminals 31, 32, and 33. The pad portion 30 may be exposed without being covered by an insulating layer and thus may be electrically connected to a controller (not shown), such as a flexible printed circuit board or a driver IC. The controller provides a data signal, a scan signal, a driving voltage, a common voltage, etc.

The driving power line 10 may be connected to the controller through a driving terminal 32 and may provide a driving voltage provided from the controller to the pixels P. The driving power line 10 may be arranged in the non-display area NDA to correspond to a side surface of the display area DA. Wires configured to supply data or scan signals to the display area DA cross the driving power line 10. In an embodiment, the connection wires CWL may be connected to the wires via contact holes.

The common power line 20 may be connected to the controller through a common terminal 33 and may provide a common voltage provided from the controller to the pixels P. The common power line 20 may be arranged in the non-display area NDA to at least partially surround the display are DA. In an embodiment, the common power line 20 may extend along other sides except for a side of the display area DA adjacent to the driving power line 10.

The dam DAM may at least partially surround the display DA in the non-display area NDA. In an embodiment, as shown in FIG. 3, the dam DAM may continuously surround the display area DA. However, one or more embodiments are not limited thereto. The dam DAM may partially surround the display area DA and may have various modifications such as surrounding the display area DA in a shape such as a dotted line.

The dam DAM may at least partially overlap the common power line 20. In some embodiments, the dam DAM may cover an outer edge of the common power line 20. In some embodiments, an inner dam (not shown) arranged toward the display area DA so as to be spaced apart from the dam DAM and/or an outer dam (not shown) arranged toward an edge of the substrate 100 may be further provided.

At least one connection wire CWL may be arranged in the bending area BA. In this case, the connection wire CWL may extend from the first area 1A to the second area 2A across the bending area BA. The connection wires CWL may extend crossing the bending axis BAX. For example, the connection wires CWL may extend vertically with respect to the bending axis BAX, but one or more embodiments are not limited thereto. Various modifications may be made; for example, the connection wire CWL may extend slanted at a certain angle with respect to the bending axis BAX. In addition, the connection wire CWL may have any of various shapes, such as a curved shape or a zigzag shape, other than a straight shape. In an embodiment, the connection wire CWL may be connected to wires disposed on different layers through contact holes.

The bending protection layer 600 may be arranged in the bending area BA to cover the connection wire CWL. In an embodiment, the bending protection layer 600 includes a light-blocking material, and an optical density of the bending protection layer 600 may have a value of 1 to 5. The bending protection layer 600 may extend across the bending area BA to a portion of the first area 1A. The bending protection layer 600 may at least partially cover the dam DAM, the driving power line 10, and the common power line 20 arranged in the non-display area NDA of the first area 1A. An end of the bending protection layer 600 may be in contact with an end of the display area DA. The bending protection layer 600 may reduce stress that may be applied to the connection wire CWL and may also prevent or substantially prevent wires and various elements arranged in the non-display area NDA from being externally visible.

Figure 4:
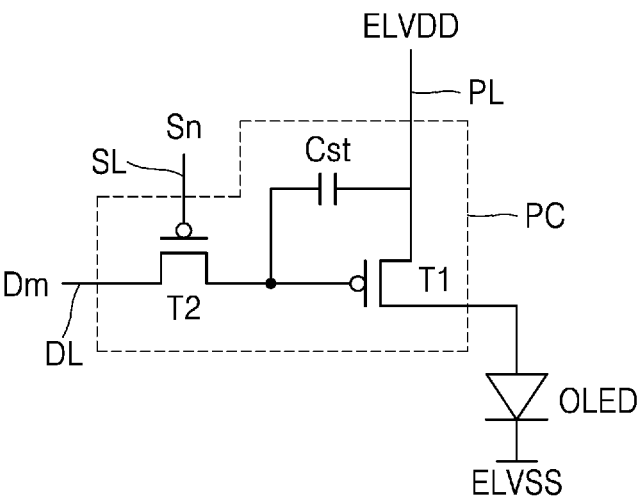
FIG. 4 is an equivalent circuit diagram of a pixel circuit according to an embodiment, which may be included in a display apparatus according to an embodiment.

FIG. 4 is an equivalent circuit diagram of a pixel circuit PC according to an embodiment, which may be included in a display apparatus according to an embodiment.

Referring to FIG. 4, each pixel circuit PC includes a driving thin-film transistor T1, a switching thin-film transistor T2, and a storage capacitor Cst, and may be connected to an organic light-emitting device OLED.

The switching thin-film transistor T2 is connected to the scan line SL and the data line DL and is configured to transmit a data signal Dm input through the data line DL to the driving thin-film transistor T1 according to a scan signal Sn input through the scan line SL.

The storage capacitor Cst is connected to the switching thin-film transistor T2 and a driving voltage line PL and stores a voltage corresponding to a difference between a voltage received from the switching thin-film transistor T2 and the driving voltage ELVDD supplied to the driving voltage line PL.

The driving thin-film transistor T1 is connected to the driving voltage line PL and the storage capacitor Cst and may be configured to control a driving current flowing through the organic light-emitting device OLED from the driving voltage line PL in response to a voltage value stored in the storage capacitor Cst. The organic light-emitting device OLED may emit light having certain brightness according to the driving current.

Although FIG. 4 shows a case in which the pixel circuit PC includes two thin-film transistors and one storage capacitor, one or more embodiments are not limited thereto. Various modifications may be made; for example, the pixel circuit PC may include three or more thin-film transistors.

Figure 5:
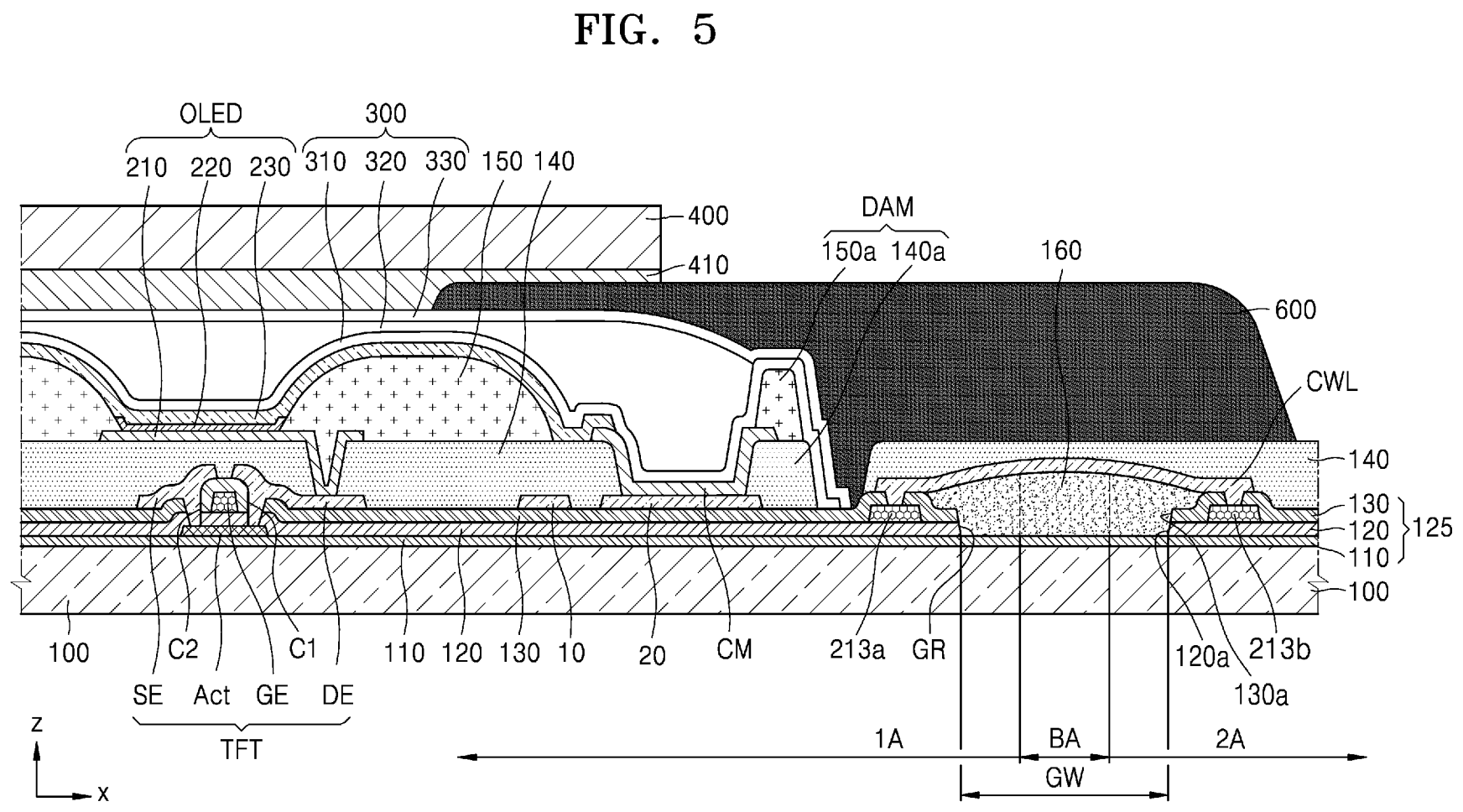

FIG. 5 is a partial cross-sectional view of the display apparatus of FIG. 3, taken along the line I-I'. FIG. 5 shows the display apparatus in an unbent state.

In FIG. 5, the organic light-emitting device OLED is located in the display area DA as a display device. The organic light-emitting device OLED electrically connected to a thin-film transistor TFT may be understood as a pixel electrode 210 electrically connected to the thin-film transistor TFT. In some cases, a thin-film transistor (not shown) may also be arranged in a peripheral area at an outside of the display area DA of the substrate 100. The thin-film transistor located in the peripheral area may be, for example, a portion of a circuit unit for controlling an electric signal which is applied into the display area DA.

The thin-film transistor TFT may include a semiconductor layer Act including amorphous silicon, polycrystalline silicon, an oxide semiconductor, or an organic semiconductor material, a gate electrode GE, a source electrode SE, and a drain electrode DE.

The gate electrode GE may be connected to a gate line (not shown) for applying an on/off signal to the thin-film transistor TFT and may include a low-resistance metal material. For example, the gate electrode GE may include a single layer or a multilayer including a conductive material including molybdenum (Mo), aluminum (Al), copper (Cu) and/or titanium (Ti).

The source electrode SE and the drain electrode DE may include a single layer or a multilayer including a highly conductive material and may be respectively connected to a source region and a drain region of the semiconductor layer Act. For example, the source electrode SE and the drain electrode DE may include a single layer or a multilayer including a conductive material including aluminum (Al), copper (Cu) and/or titanium (Ti).

The source electrode SE and the drain electrode DE may be connected to the semiconductor layer Act through contact holes C1 and C2. In an embodiment, the contact holes C1 and C2 may be formed by concurrently (e.g., simultaneously) etching an interlayer insulating layer 130 and a gate insulating layer 120.

The thin-film transistor TFT according to an embodiment is of a top gate type in which the gate electrode GE is disposed above the semiconductor layer Act, but one or more embodiments are not limited thereto. The thin-film transistor TFT according to another embodiment may be of a bottom gate type in which the gate electrode GE is disposed below the semiconductor layer Act.

To insulate the semiconductor layer Act from the gate electrode GE, the gate insulating layer 120 including an inorganic material, such as silicon oxide, silicon nitride, and/or silicon oxynitride may be disposed between the semiconductor layer Act and the gate electrode GE. The interlayer insulating layer 130 including an inorganic material, such as silicon oxide, silicon nitride, and/or silicon oxynitride may be disposed on the gate electrode GE, and the source electrode SE and the drain electrode DE may be disposed on the interlayer insulating layer 130. In an embodiment, the insulating layer including an inorganic material as described above may be formed by chemical vapor deposition (CVD) or atomic layer deposition (ALD), as well as for the following embodiments and modified examples thereof.

A buffer layer 110 including an inorganic material, such as silicon oxide, silicon nitride, and/or silicon oxynitride may be disposed between the thin-film transistor TFT having the above structure and the substrate 100. The buffer layer 110 may increase smoothness of an upper surface of the substrate 100 and/or may prevent or reduce permeation of impurities from the substrate 100, etc. into the semiconductor layer Act of the thin-film transistor TFT. The buffer layer 110 may include an inorganic material, such as oxide or nitride, an organic material, or an organic-inorganic compound, and may have a single-layer or multi-layer structure including an inorganic material and an organic material. In some embodiments, the buffer layer 110 may have a triple-layer structure of silicon oxide/silicon nitride/silicon oxide.

In addition, a planarization layer 140 may be disposed on the thin-film transistor TFT. For example, as shown in FIG. 5, when the organic light-emitting device OLED is disposed above the thin-film transistor TFT, the planarization layer 140 may substantially planarize an upper portion of a passivation layer covering the thin-film transistor TFT. The planarization layer 140 may include an organic material, for example, acryl, benzocyclobutene (BCB), or hexamethyld-isiloxane (HMDSO). Although FIG. 5 shows the planariza-tion layer 140 as a single layer, the planarization layer 140 may have various modifications, such as a multilayer.

In an embodiment, as shown in FIG. 5, the planarization layer 140 may have an opening outside the display area DA, and, thus, a portion of the planarization layer 140 in the display area DA and a portion of the planarization layer 140 in the second area 2A may be physically separated from each other. Accordingly, impurities from the outside or the like may be prevented or substantially prevented from reaching the display area DA through the planarization layer 140.

In the display area DA of the substrate 100, the organic light-emitting device OLED including the pixel electrode 210, an opposite electrode 230, and an intermediate layer 220 disposed therebetween and including an emission layer may be located on the planarization layer 140.

The pixel electrode 210 may contact one of the source electrode SE and the drain electrode DE through an opening portion formed in the planarization layer 140, etc. and be electrically connected to the thin-film transistor TFT. In an embodiment, the pixel electrode 210 may include a reflec-tive film including any of silver (Ag), magnesium (Mg), aluminum (AI), platinum (Pt), palladium (Pd), gold (Au), nickel (Ni), neodymium (Nd), iridium (Ir), chromium (Cr), and a compound thereof, and a transparent or semitranspar-ent electrode layer on the reflective film. In an embodiment, the transparent or semitransparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a stack structure of ITO/Ag/ITO.

A pixel-defining layer 150 may be disposed on the pla-narization layer 140. The pixel-defining layer 150 includes an opening corresponding to each sub-pixel, that is, an opening exposing at least a central portion of the pixel electrode 210, and, thus, defines a pixel. In addition, the pixel-defining layer 150 may increase a distance between an edge of the pixel electrode 210 and the opposite electrode 230 above the pixel electrode 210, thereby preventing or substantially preventing occurrence of an arc, etc. at an edge of the pixel electrode 210. The pixel-defining layer 150 may include an organic material, for example, PI or HMDSO.

The intermediate layer 220 of the organic light-emitting device OLED may include a low-molecular weight material or a polymer material. In an embodiment, when the inter-mediate layer 220 includes a low-molecular weight material, the intermediate layer 220 may have a structure in which a hole injection layer (HIL), a hole transport layer (HTL), an emission layer (EML), an electron transport layer (ETL), and an electron injection layer (EIL) are stacked in a single or complex structure, and may include various organic materials, including copper phthalocyanine (CuPc), N,N'-Di (naphthalene-1-yl)-N,N'-diphenyl-benzidine (NPB), and tris-8-hydroxyquinoline aluminum (Alq3). In an embodi-ment, these layers may be formed by vacuum deposition.

When the intermediate layer 220 includes a polymer material, the intermediate layer 220 may generally have a structure including an HTL and an EML. In an embodiment, the HTL may include poly(3,4-ethylenedioxythiophene) (PEDOT), and the EML may include a polymer material, such as a polyphenylene vinylene (PPV)-based material, a polyfluorene-based material, etc. The intermediate layer 220 may be formed by screen printing, inkjet printing, laser induced thermal imaging (LITI), or the like.

The intermediate layer 220 is not limited thereto and may have any of various other structures. The intermediate layer 220 may include a single layer that covers a plurality of pixel electrodes 210 or may include patterned layers respectively corresponding to the plurality of pixel electrodes 210.

The opposite electrode 230 is disposed on the intermedi-ate layer 220. The opposite electrode 230 may be a light-transmitting electrode or a reflective electrode. In some embodiments, the opposite electrode 230 may be a trans-parent or semitransparent electrode and may include a metal thin film with a low work function including any of Li, Ca, LiF/Ca, LiF/Al, Al, Ag, Mg, and a compound thereof. In addition, a transparent conductive oxide (TCO) film, such as ITO, IZO, ZnO, or $In_2O_3$, may be further disposed on the metal thin film. The opposite electrode 230 may be formed as a single electrode for a plurality of organic light-emitting devices OLED to correspond to the plurality of pixel elec-trodes 210.

Because the organic light-emitting device OLED may be easily damaged by external moisture or oxygen, the thin film encapsulation layer 300 may cover and protect the organic light-emitting device OLED. The thin film encapsulation layer 300 may cover the display area DA and may extend outside of the display area DA. The thin film encapsulation layer 300 may include a first inorganic encapsulation layer 310, an organic encapsulation layer 320, and a second inorganic encapsulation layer 330.

The first inorganic encapsulation layer 310 may cover the opposite electrode 230 and, in an embodiment, may include silicon oxide, silicon nitride, and/or silicon oxynitride. In some cases, other layers, such as a capping layer, may be disposed between the first inorganic encapsulation layer 310 and the opposite electrode 230. Because the first inorganic encapsulation layer 310 is formed along a structure therebe-low, an upper surface of the first inorganic encapsulation layer 310 is not flat. The organic encapsulation layer 320 may cover the first inorganic encapsulation layer 310. Unlike the first inorganic encapsulation layer 310, an upper surface of the organic encapsulation layer 320 may be substantially flat. More specifically, an upper surface of a portion of the organic encapsulation layer 320 correspond-ing to the display area DA may be substantially flat. The organic encapsulation layer 320 may include one or more materials selected from the group including polyethylene terephthalate, PEN, polycarbonate, PI, polyethylene sulfonate, polyoxymethylene, PAR, and HMDSO. The sec-ond inorganic encapsulation layer 330 may cover the organic encapsulation layer 320 and, in an embodiment, may include silicon oxide, silicon nitride, and/or silicon oxynitride. The second inorganic encapsulation layer 330 may contact the first inorganic encapsulation layer 310 at an edge thereof outside the display area DA, thereby preventing or substan-tially preventing the organic encapsulation layer 320 from being externally exposed.

In an embodiment, as described above, the thin film encapsulation layer 300 includes the first inorganic encap-sulation layer 310, the organic encapsulation layer 320, and the second inorganic encapsulation layer 330, and, accordingly, even when cracks occur in the thin film encapsulation layer 300, such a multi-layer structure may prevent or substantially prevent the cracks from being connected to each other between the first inorganic encapsulation layer 310 and the organic encapsulation layer 320 or between the organic encapsulation layer 320 and the second inorganic encapsulation layer 330. Thus, formation of a path through which external moisture or oxygen permeates the display area DA may be prevented or reduced.

The dam DAM may be arranged in the non-display area NDA outside the display area DA and control the flow of an organic material during formation of the organic encapsulation layer 320. In an embodiment, the dam DAM may have a structure in which a first layer 140a formed of a same material and on a same layer as the planarization layer 140 and a second layer 150a formed of a same material and on a same layer as the pixel-defining layer 150 are stacked. The dam DAM may include an organic insulating material, such as PI, polyamide, acrylic resin, BCB, HMDSO, phenolic resin, etc. The dam DAM may include a photosensitive organic material. The dam DAM may be spaced apart from the planarization layer 140 and the pixel-defining layer 150. In an embodiment, at one side of the dam DAM, the first inorganic encapsulation layer 310 and the second inorganic encapsulation layer 330 may contact each other.

The driving power line 10 and the common power line 20 may be arranged in the non-display area NDA. The driving power line 10 and the common power line 20 may be wires for supplying a driving voltage and a common voltage, respectively, to a pixel circuit arranged in the display area DA. The driving power line 10 and the common power line 20 may be disposed on the interlayer insulating layer 130. In some embodiments, the common power line 20 may be connected to the opposite electrode 230 of the organic light-emitting device OLED to transmit a common voltage. In an embodiment, the dam DAM may at least partially overlap the common power line 20. The dam DAM may cover an edge region of the common power line 20 distal from the display area DA. An edge adjacent to the display area DA from among edge regions of the common power line 20 may be covered by the planarization layer 140. As described above, as edge regions of the common power line 20 are covered by the dam DAM and the planarization layer 140, the common power line 20 may be protected from damage that may occur during processes.

FIG. 5 shows an example in which the common power line 20 is connected to the opposite electrode 230 via a connection conductive layer CM. In some embodiments, the connection conductive layer CM may extend to an upper surface of the first layer 140a of the dam DAM. However, one or more embodiments are not limited thereto, and the common power line 20 may have various modifications such as directly contacting the opposite electrode 230.

In some embodiments, the connection conductive layer CM may be formed of a same material as and concurrently (e.g., simultaneously) with the pixel electrode 210. In an embodiment, the connection conductive layer CM may include a reflective film including any of silver (Ag), magnesium (Mg), aluminum (AI), platinum (Pt), palladium (Pd), gold (Au), nickel (Ni), neodymium (Nd), iridium (Ir), chromium (Cr), and a compound thereof, and a transparent or semitransparent electrode layer on the reflective film. In an embodiment, the transparent or semitransparent electrode layer may include at least one selected from the group including indium tin oxide (ITO), indium zinc oxide (IZO), zinc oxide (ZnO), indium oxide (In$_2$O$_3$), indium gallium oxide (IGO), and aluminum zinc oxide (AZO).

On the thin film encapsulation layer 300, the polarizing film 400 attached thereto via an OCA 410 may be located. The polarizing film 400 may reduce reflection of external light. For example, when the external light having passed through the polarizing film 400 is reflected from an upper surface of the opposite electrode 230 and then passes through the polarizing film 400 again, a phase of the reflected external light may be changed as the incoming external light passes through the polarizing film 400 twice. As a result, a phase of reflected external light may be different from the phase of the incoming external light entering the polarizing film 400 to the extent that a destructive interference occurs. Accordingly, the reflection of external light may be reduced to increase visibility. The OCA 410 and the polarizing film 400 may overlap a portion of the non-display area NDA in addition to the display area DA. For example, the polarizing film 400 may overlap the dam DAM.

The display apparatus according to an embodiment does not necessarily include the polarizing film 400, and, in some cases, the polarizing film 400 may be omitted or replaced by another configuration. For example, the polarizing film 400 may be omitted, and a black matrix and a color filter may be used to reduce reflection of external light.

The buffer layer 110, the gate insulating layer 120, and the interlayer insulating layer 130 each including an inorganic material may be collectively referred to as an inorganic insulating layer 125. The inorganic insulating layer 125 may have a groove corresponding to the bending area BA. The groove may refer to an area in which a portion of the inorganic insulating layer 125 has been removed in a downward direction (e.g., a −z direction) and another portion thereof remains. For example, the buffer layer 110 may be continuous over the first area 1A, the bending area BA, and the second area 2A. In addition, the gate insulating layer 120 may have an opening 120a corresponding to the bending area BA, and the interlayer insulating layer 130 may also have an opening 130a corresponding to the bending area BA. Accordingly, the inorganic insulating layer 125 including the buffer layer 110, the gate insulating layer 120, and the interlayer insulating layer 130 may be understood as having a groove corresponding to the bending area BA. The inorganic insulating layer 125 may include a groove in any of various shapes different from the above-described shape. Various modifications may be made; for example, a portion of an upper surface (e.g., a +z direction) of the buffer layer 110 may be removed, or a lower surface (e.g., a −z direction) of the gate insulating layer 120 may not be removed but may remain.

The groove corresponding to the bending area BA may be understood as the groove overlapping the bending area BA. In an embodiment, an area of the groove may be larger than that of the bending area BA. In an embodiment, a groove width GW is shown as being greater than a width of the bending area BA in FIG. 5. The area of the groove may be defined as an area of an opening with a smallest area among the openings 120a and 130a of the gate insulating layer 120 and the interlayer insulating layer 130.

In the display apparatus according to an embodiment, an organic material layer 160 may fill at least a portion of the groove. That is, the organic material layer 160 may overlap the bending area BA. The organic material layer 160 may extend to a portion of a non-bending area.

In addition, the display apparatus according to an embodiment may include the connection wire CWL, and the connection wire CWL may extend from the first area 1A to the second area 2A across the bending area BA and may be located on the organic material layer 160. The connection wire CWL may be located on the inorganic insulating layer 125, such as the interlayer insulating layer 130, where the organic material layer 160 does not exist. In an embodiment, the connection wire CWL may function as a wire configured to transmit electrical signals to the display area DA, and may be formed of a same material as and concurrently (e.g., simultaneously) with the source electrode SE or the drain electrode DE.

As described above, the display apparatus is shown as unbent in FIG. 5 for the sake of convenience. However, the substrate 100, etc., of the display apparatus according to the present embodiment may be in a bent state in the bending area BA, as shown in FIG. 1. To this end, the substrate 100 of the display apparatus may be manufactured in a substantially flat state, as shown in FIG. 5, in a manufacturing process, and, thereafter, the substrate 100, etc., may be bent in the bending area BA such that the display apparatus substantially has a shape as shown in FIG. 1. In this regard, a tensile stress may be applied to the connection wire CWL during a process of bending the substrate 100, etc., at the bending area BA. However, in the display apparatus according to an embodiment, the occurrence of defects in the connection wire CWL during the bending process may be prevented or reduced.

When the inorganic insulating layer 125 has no groove and thus has a continuous shape from the first area 1A to the second area 2A, and the connection wire CWL is located on the inorganic insulating layer 125, a high tensile stress is applied to the connection wire CWL during a process of bending the substrate 100, etc. Particularly, because a hardness of the inorganic insulating layer 125 is greater than that of an organic material layer, there is a very high probability that a crack, etc., occurs in the inorganic insulating layer 125 in the bending area BA. When a crack occurs in the inorganic insulating layer 125, there is a very high probability that the crack, etc., also occurs in the connection wire CWL on the inorganic insulating layer 125 and, thus, defects such as disconnection in the connection wire CWL may occur.

However, in the display apparatus according to an embodiment, as described above, the inorganic insulating layer 125 has a groove in the bending area BA, and a portion of the connection wire CWL in the bending area BA is located on the organic material layer 160, which fills at least a portion of the groove of the inorganic insulating layer 125. Because the inorganic insulating layer 125 has a groove in the bending area BA, the probability that cracks, etc., occur in the inorganic insulating layer 125 is significantly low, and, in the case of the organic material layer 160, the probability of cracks occurring is low because the organic material layer 160 includes an organic material. Accordingly, the occurrence of cracks, etc., in a portion of the connection wire CWL located on the organic material layer 160 in the bending area BA may be prevented, or the probability of cracks occurring may be reduced. Because the hardness of the organic material layer 160 is less than that of an inorganic material layer, the organic material layer 160 may absorb a tensile stress caused by bending of the substrate 100, etc., thereby effectively reducing concentration of the tensile stress on the connection wire CWL.

The display apparatus according to an embodiment may include conductive layers 213a and 213b connected to the connection wire CWL, in addition to the connection wire CWL. In an embodiment, the conductive layers 213a and 213b may be arranged in the first area 1A and the second area 2A, respectively, and be located on a layer different from a layer on which the connection wire CWL is located. The conductive layers 213a and 213b may be electrically connected to the connection wire CWL. FIG. 5 shows that, in an embodiment, the conductive layers 213a and 213b include a same material as the gate electrode GE of the thin-film transistor TFT and are on a same layer as the gate electrode GE, that is, on the gate insulating layer 120. In an embodiment, it is illustrated that the connection wire CWL contacts the conductive layers 213a and 213b via contact holes formed in the interlayer insulating layer 130. It is also illustrated that the conductive layer 213a is in the first area 1A and the conductive layer 213b is in the second area 2A.

The conductive layer 213a in the first area 1A may be electrically connected to the thin-film transistor, etc., in the display area DA, and, accordingly, the connection wire CWL may be electrically connected to the thin-film transistor, etc., in the display area DA via the conductive layer 213a. The conductive layer 213b in the second area 2A may also be electrically connected to the thin-film transistor, etc. in the display area DA via the connection wire CWL. The conductive layers 213a and 213b may be electrically connected to elements in the display area DA while being outside the display area DA, or may extend to the display area DA while being outside the display area DA such that at least a portion of the conductive layers 213a and 213b may be in the display area DA.

The connection wire CWL crossing the bending area BA may include a material having a high elongation, to prevent or substantially prevent cracks in the connection wire CWL or defects such as disconnection in the connection wire CWL. In addition, the conductive layers 213a and 213b including a material having an elongation lower than that of the connection wire CWL and electrical/physical characteristics different from those of the connection wire CWL may be formed in the first area 1A or the second area 2A to improve the efficiency of electrical signal transmission in the display apparatus or reduce a failure rate in a manufacturing process. In an embodiment, for example, the conductive layers 213a and 213b may include molybdenum, and the connection wire CWL may include aluminum. In some cases, the connection wire CWL or the conductive layers 213a and 213b may have a multi-layer structure.

In the case of the conductive layer 213b in the second area 2A, at least a portion of an upper portion thereof may not be covered by the planarization layer 140, etc., but be exposed to the outside, unlike that shown in FIG. 5, and thus may be electrically connected to various electronic devices, a printed circuit board, etc.

The bending protection layer 600 may be disposed on the connection wire CWL in the bending area BA. As described above, the bending protection layer 600 may function as a stress neutralization layer for protecting the connection wire CWL and a black matrix for reducing viewing angle dead space. In an embodiment, an optical density of the bending protection layer 600 may have a range of 1 to 5.

In an embodiment, the bending protection layer 600 may include an organic material, and Cr or CrOx, Cr/CrOx, Cr/CrOx/CrNy, a resin (carbon pigment or RGB mixed pigment), graphite, or non-Cr group material, as a material for adjusting optical density. The bending protection layer 600 may be formed by applying and curing a liquid or paste material.

The bending protection layer 600 may cover an end of the thin film encapsulation layer 300 and may at least partially overlap the thin film encapsulation layer 300. The bending protection layer 600 may overlap the dam DAM. The bending protection layer 600 may overlap the driving power line 10 and the common power line 20.

The bending protection layer 600 may be at least partially disposed between the thin film encapsulation layer 300 and the polarizing film 400. The bending protection layer 600 may be at least partially disposed between the thin film encapsulation layer 300 and the OCA 410. The bending protection layer 600 may at least partially overlap the pixel-defining layer 150. The bending protection layer 600 may at least partially overlap the opposite electrode 230.

As described above, because the bending protection layer 600 may be arranged adjacent to the display area DA in which the display devices ED are arranged, various elements arranged in the non-display area NDA may not be externally visible, and, accordingly, an area of the non-display area NDA may be freely adjusted.

In addition, in the display apparatus according to an embodiment, a touch electrode (not shown) having various patterns to provide a touchscreen function may be disposed on the thin film encapsulation layer 300, and a touch protection layer covering the touch electrode may be disposed to protect the touch electrode. The display apparatus may further include the protection film 700 (refer to FIG. 2) for protecting a lower surface (e.g., a −z direction) of the substrate 100. In an embodiment, the protection film 700 may include an opening corresponding to the bending area BA.

Figure 6:
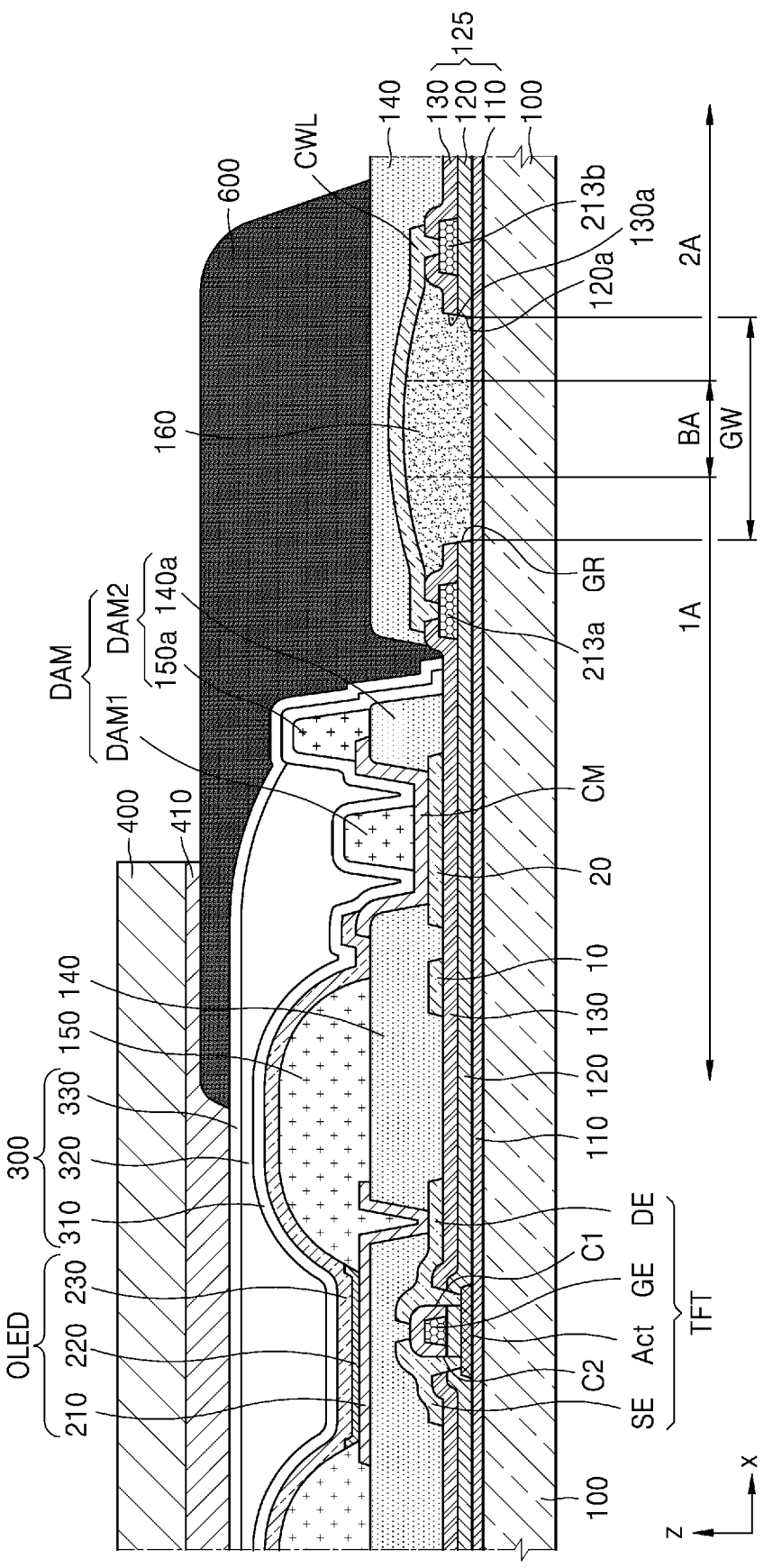
FIG. 6 is a schematic cross-sectional view of a portion of a display apparatus according to an embodiment.

FIG. 6 is a schematic cross-sectional view of a portion of a display apparatus according to an embodiment. In FIG. 6, elements that are the same as those in FIG. 5 are designated by the same reference numerals, and, thus, a repeated description thereof is omitted.

Referring to FIG. 6, a display apparatus according to an embodiment includes the connection wire CWL arranged in the bending area BA and the bending protection layer 600 disposed on the connection wire CWL, and the bending protection layer 600 includes a light-blocking material. In an embodiment, an optical density of the bending protection layer 600 may have a range of 1 to 5.

In an embodiment, the display apparatus may include a first dam DAM1 and a second dam DAM2. The first dam DAM1 may be spaced apart from the second dam DAM2 and be adjacent to the display area DA. In an embodiment, the first dam DAM1 may be formed of a same material as and concurrently (e.g., simultaneously) with the pixel-defining layer 150. In an embodiment, the second dam DAM2 may have a structure in which the first layer 140a including a same material as the planarization layer 140 and the second layer 150a including a same material as the pixel-defining layer 150 are stacked. In an embodiment, a height of the first dam DAM1 may be less than that of the second dam DAM2.

In an embodiment, the first dam DAM1 may overlap a center of the common power line 20. In an embodiment, two ends of the first dam DAM1 may both overlap the common power line 20. The connection conductive layer CM may be disposed between the first dam DAM1 and the common power line 20. The second dam DAM2 may cover an edge of the common power line 20. As a plurality of dams, for example, the first and second dams DAM1 and DAM2, are provided. The flow of an organic material may be effectively blocked when the organic encapsulation layer 320 is formed.

The bending protection layer 600 may cover an end of the thin film encapsulation layer 300 and may at least partially overlap the thin film encapsulation layer 300. The bending protection layer 600 may overlap the first dam DAM1 and the second dam DAM2. The bending protection layer 600 may overlap the driving power line 10 and the common power line 20.

The bending protection layer 600 may be at least partially disposed between the thin film encapsulation layer 300 and the polarizing film 400. The bending protection layer 600 may be at least partially disposed between the thin film encapsulation layer 300 and the OCA 410. The bending protection layer 600 may at least partially overlap the pixel-defining layer 150. The bending protection layer 600 may at least partially overlap the opposite electrode 230.

Figure 7:
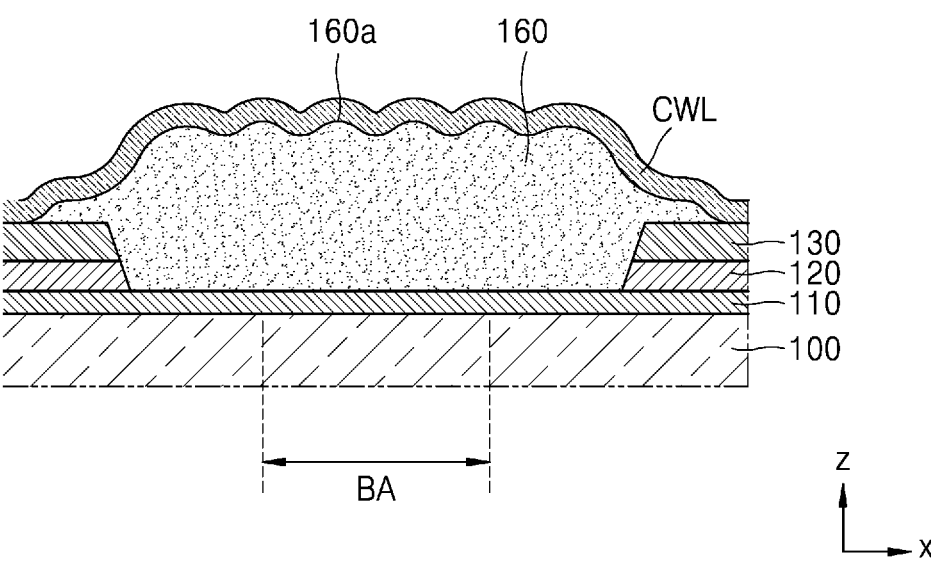
FIG. 7 is a cross-sectional view of a portion of a display apparatus according to one or more embodiments.
Figure 8:
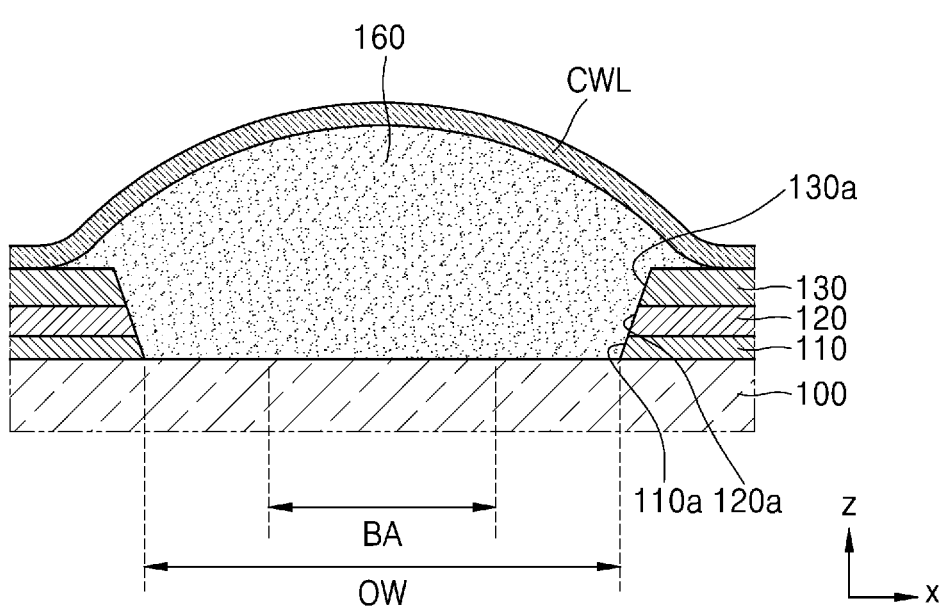
FIG. 8 is a cross-sectional view of a portion of a display apparatus according to one or more embodiments.

FIGS. 7 and 8 are cross-sectional views of a portion of a display apparatus according to one or more embodiments. More specifically, FIGS. 7 and 8 are cross-sectional views showing a region of and neighboring the bending area BA.

Referring to FIG. 7, at least a portion of an upper surface (e.g., in +z direction) of the organic material layer 160 that is arranged in a groove of the inorganic insulating layer 125 may have a corrugated surface. Accordingly, a surface area of the upper surface of the organic material layer 160 and the surface area of upper and lower surfaces of the connection wire CWL in the groove GR increase. A larger surface area of the upper surface of the organic material layer 160 and the upper and lower surfaces of the connection wire CWL denotes more room for a shape change to reduce a tensile stress due to bending of the substrate 100, etc.

For reference, because the connection wire CWL is on the organic material layer 160, the lower surface of the connection wire CWL may have a shape corresponding to a corrugated surface 160a of the organic material layer 160.

The corrugated surface 160a of the upper surface (in +z direction) of the organic material layer 160 may be formed by various methods. For example, when the organic material layer 160 is formed, particular portions may be relatively more etched (removed) than other portions, by using a photosensitive material and varying the amount of exposure via a slit mask or a half-tone mask on various portions of an upper surface of the organic material layer 160, which are still in a substantially flat state. In this regard, more etched portions may be understood as concave portions on the upper surface of the organic material layer 160. However, a method used to manufacture the display apparatus according to the present embodiment is not limited thereto. Various methods may be used; for example, particular portions may be removed via dry etching, etc., after the organic material layer 160 having a substantially flat upper surface is formed.

Referring to FIG. 8, the inorganic insulating layer 125 may have an opening corresponding to the bending area BA. In this regard, the opening of the inorganic insulating layer 125 may refer to an area in which a layer disposed under the inorganic insulating layer 125 is exposed. That is, the buffer layer 110, the gate insulating layer 120, and the interlayer insulating layer 130 may respectively have openings 110a, 120a, and 130a corresponding to the bending area BA. The opening corresponding to the bending area BA may be understood as the opening overlapping the bending area BA. In this regard, an area of the opening may be larger than that of the bending area BA. To this end, an opening width OW is shown as greater than a width of the bending area BA in FIG. 8. The area of the opening may be defined as an area of an opening with the smallest area among the openings 110a, 120a, and 130a of the buffer layer 110, the gate insulating layer 120, and the interlayer insulating layer 130. FIG. 8 shows that the area of the opening is defined by an area of the opening 110a of the buffer layer 110.

Because the hardness of the inorganic insulating layer 125 is greater than that of the organic material layer 160, there is a very high probability that a crack occurs in the inorganic insulating layer 125 in the bending area BA. When a crack occurs in the inorganic insulating layer 125, there is a high probability that the crack propagates to the connection wire CWL. The probability of a crack occurring in the inorganic insulating layer 125 may be reduced by forming a groove in the inorganic insulating layer 125, but the probability of a crack occurring in the inorganic insulating layer 125 may be further reduced by forming the opening 110a in the buffer layer 110 in the bending area BA.

Figure 9:
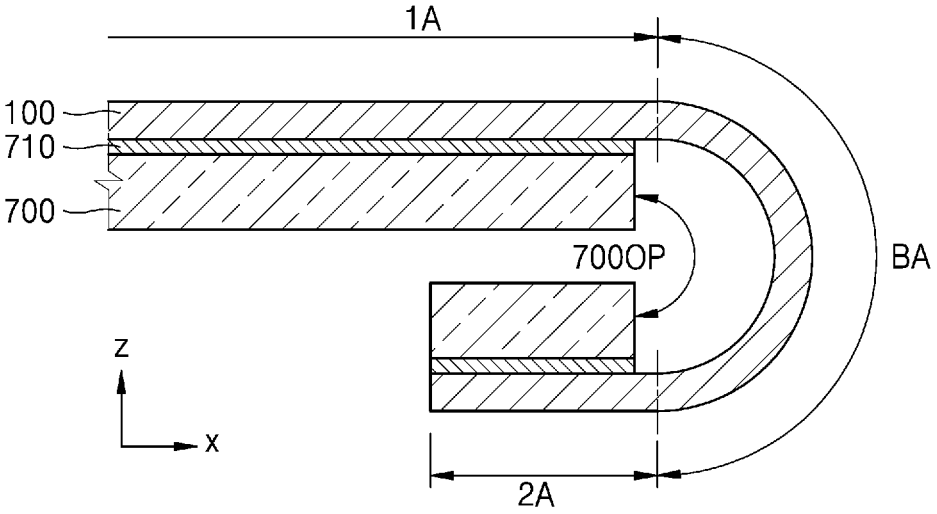
FIG. 9 is a cross-sectional view of a portion of a display apparatus according to one or more embodiments.
Figure 10:
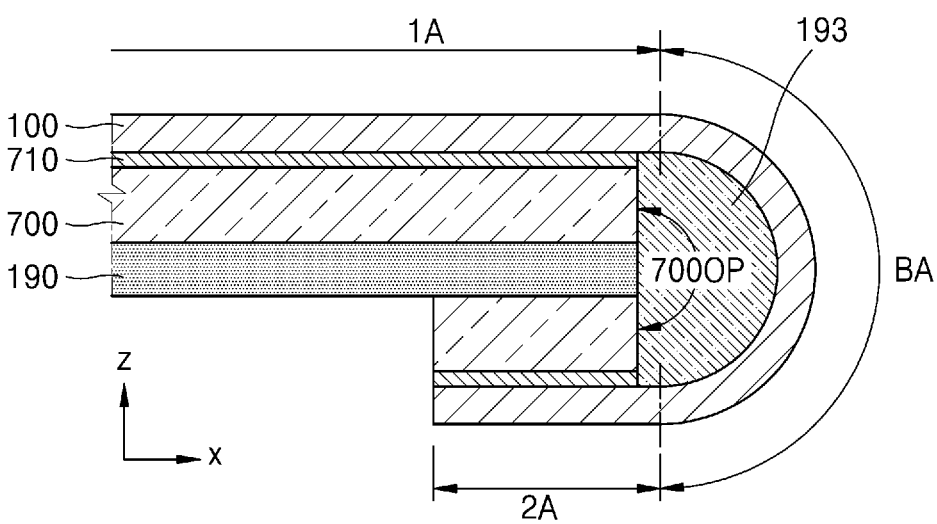
FIG. 10 is a cross-sectional view of a portion of a display apparatus according to one or more embodiments.

FIGS. 9 and 10 are cross-sectional views of a portion of a display apparatus according to one or more embodiments. More specifically, FIGS. 9 and 10 show the substrate 100 and the protection film 700 therebelow.

Referring to FIG. 9, the protection film 700 may be attached to a lower surface of the substrate 100 via an adhesive layer 710. In an embodiment, the adhesive layer 710 may be a pressure sensitive adhesive and may have adhesiveness weakened by ultraviolet (UV) radiation.

The protection film 700 may protect a lower surface of the substrate 100. That is, because the protection film 700 protects the lower surface of the substrate 100, the protection film 700 may have a rigidity. Thus, when flexibility of the protection film 700 is low, exfoliation may occur between the protection film 700 and the substrate 100 as the substrate 100 is bent. Accordingly, the protection film 700 may have an opening portion 700_OP or a groove corresponding to the bending area BA, thereby effectively preventing or substantially preventing such exfoliation. To this end, an area of the opening portion 700_OP or the groove of the protection film 700 may be larger than that of the bending area BA. In an embodiment, to form the opening portion 700_OP or the groove of the protection film 700, at least a portion of the protection film 700 may be removed by irradiating an infrared laser beam to an area of the protection film 700 corresponding to the bending area BA, and, thus, the opening portion 700_OP may be formed.

In an embodiment, as shown in FIG. 10, after the substrate 100, etc. is bent, a cushion layer 190 may be further arranged in an area where the first area 1A and the second area 2A face each other. That is, the cushion layer 190 may be in contact with a portion of the protection film 700 in the first area 1A and a portion of the protection film 700 in the second area 2A. After the substrate 100 is bent, the cushion layer 190 may be arranged in a space in which the first area 1A and the second area 2A are spaced apart from each other, and thus may support a display panel and absorb shock. The cushion layer 190 may include an elastic material.

In an embodiment, a filler 193 may be further arranged in the opening portion 700_OP of the protection film 700. The filler 193 may be formed by injecting a liquid or paste material into the opening 700_OP of the protection film 700 and curing the liquid or paste material. In an embodiment, the filler 193 may be cured by irradiating UV light or applying heat thereto. The filler 193 may include an adhesive material, and, as the filler 193 is cured by UV light or heat, deformation of the substrate 100 may be prevented or reduced by a restoring force that restores the substrate 100 to a state before being bent. In an embodiment, the cushion layer 190 and/or the filler 193 may be omitted. In another embodiment, the cushion layer 190 or the filler 193 may be used.

According to one or more of the above embodiments, a display apparatus may include a bending protection layer, and the bending protection layer may include a light-blocking material, thereby relieving stress in a bending area and reducing the area of a non-display area for viewing angle.

It is to be understood that embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it is to be understood by those of ordinary skill in the art that various changes in form and details may be made therein without departing from the spirit and scope as set forth in the following claims.

What is claimed is:

1. A display apparatus comprising:
a substrate comprising a first area, a second area, and a bending area between the first area and the second area;
a plurality of display devices arranged in a display area of the first area;
a thin film encapsulation layer covering the plurality of display devices and comprising a first inorganic encapsulation layer, an organic encapsulation layer, and a second inorganic encapsulation layer;
a polarizing film over the thin film encapsulation layer in the first area;
an adhesive layer between the thin film encapsulation layer and the polarizing film in the first area;
a dam surrounding at least a portion of the display area;
a driving power line arranged between the display area and the dam;
a connection wire extending from the first area to the second area across the bending area; and
a bending protection layer covering the connection wire in the bending area, covering and contacting at least a portion of the thin film encapsulation layer, covering at least a portion of the dam, and covering the driving power line,
wherein the bending protection layer comprises a light-blocking material, and
wherein at least a portion of the bending protection layer is disposed under both the adhesive layer and the polarizing film, and overlaps with both the adhesive layer and the polarizing film.

2. The display apparatus of claim 1, wherein an optical density of the bending protection layer is greater than or equal to 1 and less than or equal to 5.

3. The display apparatus of claim 1, further comprising a common power line at least partially surrounding the display area,
wherein the dam covers an edge of the common power line.

4. The display apparatus of claim 1, wherein the dam comprises a first dam and a second dam spaced apart from each other,
wherein the bending protection layer overlaps the first dam and the second dam.

5. The display apparatus of claim 1, wherein the plurality of display devices comprises a common opposite electrode, and the bending protection layer covers an end of the common opposite electrode.

6. The display apparatus of claim 1, wherein emission areas of the plurality of display devices are defined by openings in a pixel-defining layer arranged in the first area, and the bending protection layer at least partially overlaps the pixel-defining layer.

7. The display apparatus of claim 1, further comprising:

an inorganic insulating layer arranged on the substrate and comprising an opening or a groove corresponding to the bending area; and an organic material layer arranged between the inorganic insulating layer and the connection wire and filling the opening or the groove.

8. The display apparatus of claim 1, wherein at least a portion of the bending protection layer is between the substrate and the polarizing film.

9. The display apparatus of claim 1, further comprising an inorganic insulating layer arranged on the substrate and comprising an opening or a groove corresponding to the bending area, wherein the inorganic insulating layer is between the substrate and the connection wire.

10. The display apparatus of claim 9, further comprising an organic material layer arranged between the inorganic insulating layer and the connection wire and filling the opening or the groove.

11. The display apparatus of claim 10, wherein at least a portion of an upper surface of the organic material layer comprises a corrugated surface.

12. The display apparatus of claim 1, further comprising a protection film on a lower surface of the substrate, wherein the protection film comprises an opening portion corresponding to the bending area.

13. A display apparatus comprising:

a substrate comprising a first area, a second area, and a bending area between the first area and the second area;

a plurality of display devices arranged in a display area of the first area;

a dam surrounding at least a portion of the display area;

a driving power line disposed between the display area and the dam and extending in a first direction;

a polarizing film arranged in the first area and located over the plurality of display devices;

an adhesive layer disposed under the polarizing film;

a connection wire extending from the first area to the second area in a second direction intersecting the first direction across the bending area; and a bending protection layer covering the connection wire in the bending area, wherein at least a portion of the bending protection layer overlaps the polarizing film and the driving power line, and the bending protection layer comprises a light-blocking material, wherein, in the first area, a thickness of a portion of the bending protection layer overlapping the connection wire is greater than a thickness of another portion of the bending protection layer overlapping the dam, and wherein at least a portion of the bending protection layer is disposed under both the adhesive layer and the polarizing film, and overlaps with both the adhesive layer and the polarizing film.

14. The display apparatus of claim 13, wherein an optical density of the bending protection layer is greater than or equal to 1 and less than or equal to 5.

15. The display apparatus of claim 13, further comprising:

a thin film encapsulation layer covering the plurality of display devices and comprising a first inorganic encapsulation layer, an organic encapsulation layer, and a second inorganic encapsulation layer, wherein the plurality of display devices is arranged in the display area, wherein the bending protection layer overlaps at least a portion of the dam.

16. The display apparatus of claim 15, further comprising a common power line at least partially surrounding the display area, wherein the dam covers an edge of the common power line.

17. The display apparatus of claim 13, wherein the plurality of display devices comprises a common opposite electrode, and the bending protection layer covers an end of the common opposite electrode.

18. The display apparatus of claim 13, wherein emission areas of the plurality of display devices are defined by openings in a pixel-defining layer arranged in the first area, and the bending protection layer at least partially overlaps the pixel-defining layer.

19. The display apparatus of claim 13, further comprising:

an inorganic insulating layer arranged on the substrate and comprising an opening or a groove corresponding to the bending area; and an organic material layer arranged between the inorganic insulating layer and the connection wire and filling the opening or the groove.

\* \* \* \* \*